United States Patent [19]

Hughes

[11] Patent Number: 5,021,692
[45] Date of Patent: Jun. 4, 1991

[54] INTEGRATOR CIRCUIT

[75] Inventor: John B. Hughes, Hove, England

[73] Assignee: U.S. Philips Corporation, New York, N.Y.

[21] Appl. No.: 446,518

[22] Filed: Dec. 4, 1989

[30] Foreign Application Priority Data

Dec. 8, 1988 [GB] United Kingdom ............... 8828666

[51] Int. Cl.$^5$ .............................................. G05F 3/24
[52] U.S. Cl. .................................. 307/490; 323/316; 328/151; 307/353
[58] Field of Search ............... 307/490, 353; 365/182, 365/183; 328/151, 127; 323/316

[56] References Cited

U.S. PATENT DOCUMENTS

| | | | |
|---|---|---|---|
| 4,864,217 | 9/1989 | Bird | 323/316 |
| 4,866,368 | 9/1989 | Bird | 323/316 |
| 4,897,596 | 1/1990 | Hughes | 323/315 |
| 4,958,123 | 9/1990 | Hughes | 323/316 |

Primary Examiner—Stanley D. Miller
Assistant Examiner—Scott A. Ouellette
Attorney, Agent, or Firm—Bernard Franzblau

[57] ABSTRACT

A bilinear integrator circuit includes a first input (1) and a second input (5) with the first input connected to the input of a first current memory cell formed by two transistors (T1, T2), a capacitor (C1), and a switch (S1). The first current memory cell is arranged to store a current applied to its input during a first portion $\phi$ of each sampling period and to reproduce that current at its output during a second portion $\phi$ of the succeeding sampling period. The second input is connected via a further switch (S2) to the input of a second current memory cell formed by three transistors (T3, T4 and T5), capacitor (C2) and a switch (S3). During a second portion $\phi$ of each sampling period the current applied to the second input and the current produced at the output of the first current memory cell are applied to the input of the second current memory cell. The second current memory cell has two outputs (from the drain electrodes of transistors T4, T5). The first output (from T4) is fed back to the input of the first current memory cell while the second output (at T5) is coupled to the integrator output (8).

18 Claims, 4 Drawing Sheets

INTEGRATOR CIRCUIT

BACKGROUND OF THE INVENTION

This invention relates to a bilinear integrator circuit for sampled signal currents.

The invention provides a bilinear integrator circuit for sampled signal currents comprising first and second inputs and an output, means for connecting the first input to the input of a first current memory cell which is arranged to store the current applied in a first portion of each sampling period and to reproduce a current, whose magnitude is dependent on that of the applied current, at an output during a second portion of that or a succeeding sample period, means for connecting the second input to the input of a second current memory bell which is arranged to store the current applied to its input in the second portion of each sampling period and to reproduce at each of a plurality of outputs a current, whose magnitude is dependent upon that of the current applied to its input, during the first portion of that or a succeeding sampling period, means for connecting the first output of the second current memory cell to the input of the first current memory cell, means for connecting the output of the first current memory cell to the input of the second current memory cell, and means for connecting the second output of the second current memory cell to the output of the integrator circuit.

UK Patent Application No. 8721758 (equivalent U.S. Pat. No. 4,864,217) discloses a method of processing sampled analogue electrical signals comprising the steps of a) converting each sample into a current if it is not already in that form;

b) combining, in predetermined proportions, the input sample current in a present sample period with the sample current(s) derived from input sample current(s) in one or more preceding sample periods; and c) deriving the processed output signal from the combined current produced by step b) in successive sampling periods.

SUMMARY OF THE INVENTION

The present invention provides an integrator circuit which operates according to the disclosed method and which consequently possesses the characteristics and advantages set out in the referenced application.

These characteristics and advantages include the fact that the mathematics concerned with the application of z-transforms to switched capacitor circuits is equally valid for the circuits using the method disclosed in the referenced application. However, the high quality linear capacitors required for switched capacitor circuits are not necessary and consequently the second polysilicon layer normally used to produce the capacitors in switched capacitor integrated circuits may not be necessary, giving a true VLSI compatibility. In this respect it should be realised that standard processes for the production of VLSI circuits are normally optimized for the production of digital rather than analog circuitry.

The second current memory cell may be constructed so that the output current produced at its first output is equal to B times the current applied to its input, where B is less than one.

This enables a lossy integrator to be produced. Clearly when B is equal to one an ideal integrator is produced. Lossy integrators may be used in conjunction with ideal integrators to form various bi-quadratic filter sections, for example, the Tow-Thomas bi-quadratic section.

The integrator may further comprise means for adding a bias current to the current applied to the first input of the integrator and means for subtracting appropriately scaled bias currents from the first and second output currents of the second current memory cell so that the output current produced by the integrator contains no bias current component.

This enables bidirectional currents to be processed while maintaining unidirectional currents at the inputs to the current memory cells and enables integrator circuits to be formed which produce bidirectional signal current output having no bias current component. Thus an integrator circuit can be constructed which operates on bidirectional input signal currents and produces bidirectional output signal currents, all necessary bias currents being produced within the integrator circuit. This eases the problem of matching the bias current sources when a plurality of integrator circuits are interconnected to form a filter as they can be integrated in close proximity, thus minimizing the effect of process variables which may exist across the often extensive chip area of a VLSI circuit.

The first current memory cell may comprise an input connected to a diode connected field effect transistor, the gate electrode of which is connected through a switch to the gate electrode of a second similarly constructed field effect transistor, the first and second transistors having their source electrodes connected to a common point, an output connected to the drain electrode of the second transistor, a capacitor connected between the source and gate electrodes of the second transistor, and means for closing the switch only during the first portion of each sampling period.

This provides a convenient circuit implementation for the current memory cell, the output current being available throughout a sampling period apart from the short time during which the capacitor is charged by the input current during the first portion of the sampling period. This circuit is basically a current mirror circuit whose input and output branches are isolated by the switch, the current being maintained in the output branch by the charge on the capacitor. Consequently, any techniques used to improve the performance of current mirror circuits could be used with the current memory circuit, for example, cascode connection in the input and output branches, source degeneration, dynamic element matching, multiple output paths having the same or different currents.

Alternatively, the first current memory cell may comprise a first switch connected between its input and the drain electrode of a field effect transistor, a second switch connected between the gate and drain electrodes of the transistor, a capacitor connected between the gate and source electrodes of the transistor, a third switch connected between the drain electrode of the transistor and its output, means for closing the first and second switches only during the first portion of each sampling period, and means for closing the third switch only during the second portion of each sampling period.

This alternative current memory cell has the advantage that the same transistor is used as the input diode and the output device, thus eliminating errors due to device mismatch, but has the disadvantage that the output current is only available during the second portion of each sampling period.

The integrator circuit may be arranged for integrating a differential input current and for producing a differential output current, in which case the integrator circuit may further comprise a second output, a third current memory cell, a fourth current memory cell, means for coupling an output of the third current memory cell to the input of the fourth current memory cell, means for coupling a first output of the fourth current memory cell to the input of the third current memory cell, means for connecting the first input of the integrator circuit to the input of the first current memory cell during the first portion of each sampling period, means for connecting the first input of the integrator circuit to the input of the fourth current memory cell during the second portion of each sampling period, means for connecting the second input of the integrator circuit to the input of the third current memory cell during the first portion of each sampling period, means for connecting the second input of the integrator circuit to the input of the second current memory cell during the second portion of each sampling period, means for connecting the second output of the second current memory cell to the first output of the integrator circuit, and means for connecting a second output of the fourth memory cell to the second output of the integrator circuit.

This provides a double balanced differential integrator circuit. As is well known, double balanced differential circuits suppress common mode input signals and power supply noise signals and consequently an improved performance over single ended integrators can be achieved.

The integrator may further comprise means for adding bias currents to the currents applied to the inputs of the first and third current memory cells and means for subtracting appropriately scaled bias currents from the outputs of the second and fourth current memory cells so that the output differential currents contain no bias current component.

The integrator circuit may be constructed so that all transistors which conduct signal currents are constructed as n-channel field effect transistors.

This has the advantage of minimizing the signal voltage swing at the interface between circuit modules and also reduces the signal voltages at given currents for the same physical size of transistors because of the greater electron mobility in n-channel devices.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
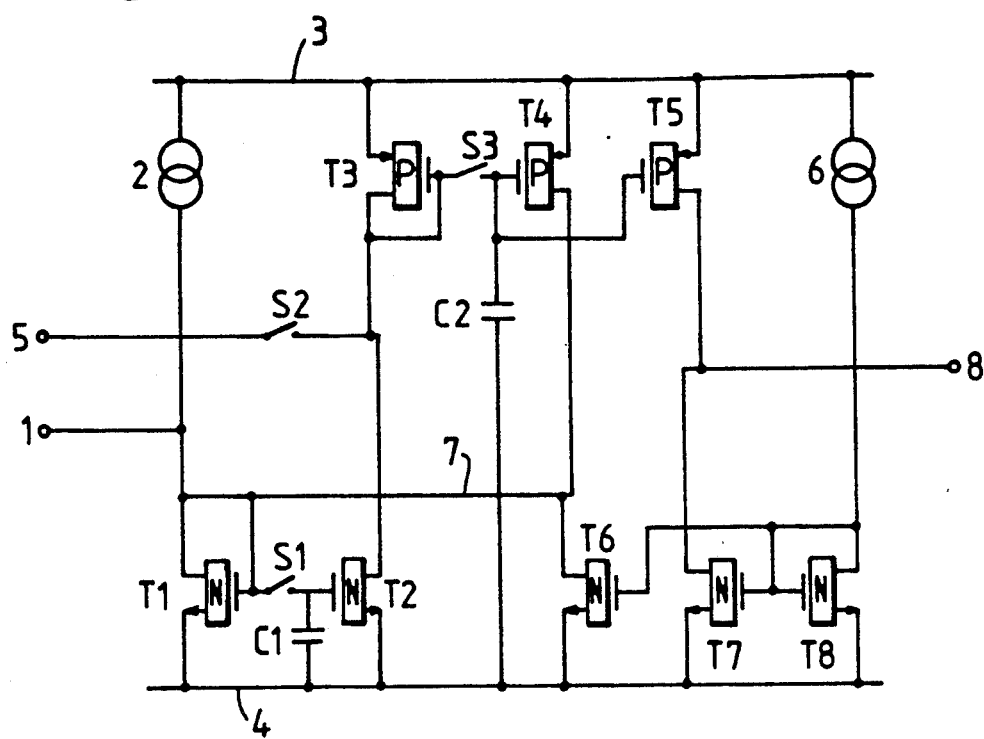
FIG. 1 is a circuit diagram of a first embodiment of an integrator circuit according to the invention.

FIG. 1 shows a single ended bilinear ideal integrator circuit using a switched current signal processing method in which a sampled analog input signal is processed. The circuit shown in FIG. 1 has a first input terminal 1 which is connected to the junction of a current source 2 which produces a bias current j and the drain electrode of an n-channel field effect transistor T1. The other end of the current source 2 is connected to a positive supply rail 3 while the source electrode of transistor T1 is connected to a negative supply rail 4. The drain electrode of transistor T1 is connected to its gate electrode and to one end of a switch S1. The other end of switch S1 is connected to the junction of the gate electrode of an n-channel field effect transistor T2 and one end of a capacitor C1 whose other end is connected to the negative supply rail 4. A second input terminal 5 is connected via a switch S2 to the junction of the drain electrode of transistor T2 and the drain electrode of a p-channel field effect transistor T3. The source electrode of transistor T2 is connected to the negative supply rail 4 while the source electrode of transistor T3 is connected to the positive supply rail 3. The drain electrode of transistor T3 is further connected to its gate electrode and to one end of a switch S3. The other end of the switch S3 is connected to one end of a capacitor C2 whose other end is connected to the negative supply rail 4 and to the gate electrodes of two further p-channel field effect transistors T4 and T5. The source electrode of transistor T4 is connected to the positive supply rail 3 while its drain electrode is connected to the drain electrode of an n-channel field effect transistor T6 whose source electrode is connected to the negative supply rail 4. A feedback connection 7 is made between the drain electrode of transistor T4 and the drain electrode of transistor T1. A current source 6, which produces a bias current j, is connected between the positive supply rail 3 and the drain electrode of an n-channel field effect transistor T8 whose source electrode is connected to the negative supply rail 4. The drain electrode of transistor T8 is connected to its gate electrode and to the gate electrodes of transistor T6 and an n-channel field effect transistor T7. The source electrode of transistor T7 is connected to the negative supply rail 4 while its drain electrode is connected to the drain electrode of transistor T5 and to an output terminal 8.

Figure 2:
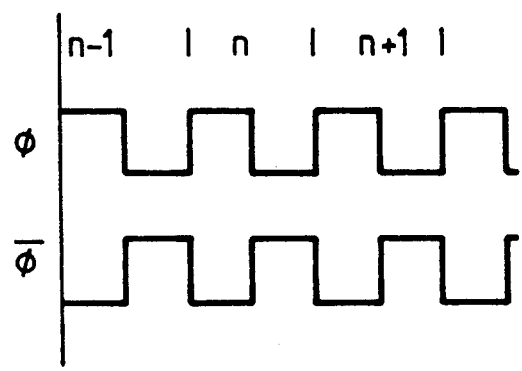
FIG. 2 is a timing diagram for the operation of switches in the integrator circuits shown in FIG. 1 and FIGS. 3 to 5.

The switches S1, S2, and S3 are controlled by waveforms $\overline{\phi}$ and $\phi$ shown in FIG. 2, the switch S1 being closed when the signal $\overline{\phi}$ is high, which will be referred to hereinafter as the $\overline{\phi}$ phase, and the switches S2 and S3 being closed when the signal $\phi$ is high, which will be referred to hereinafter as the $\phi$ phase. The signals $\phi$ and $\overline{\phi}$ are such that the $\phi$ and $\overline{\phi}$ phases do not overlap and that each phase occurs once in each sampling period (n−1), n, (n+1) etc. of the input signal.

The transistors T1 and T2, the switch S1, and the capacitor C1 form a first current memory cell which stores a current fed to the drain electrode of transistor T1 in the $\overline{\phi}$ phase and makes it available at the drain electrode of transistor T2 during the $\phi$ phase of the next sampling period. During the $\overline{\phi}$ phase the input current is available at the output but will only be valid once the capacitor C1 becomes charged to the gate-source potential of transistor T1. Similarly, the transistors T3 and T4, the switch S3, and the capacitor C2 form a second current memory cell which stores a current fed to drain electrode of transistor T3 during the $\phi$ phase of a sampling period and makes it available at the drain electrode of transistor T4 during the $\overline{\phi}$ phase of the sampling period. The transistor T5 will produce a current which is related to that fed to transistor T3 but which is multiplied by a factor A. This is achieved by appropriately selecting the channel width/length ratios of transistors T3 and T5 as is well known in the design of MOS current mirror circuits. The current memory cells operate by causing the capacitor to be charged to the gate-source potential of the transistors when the switch is closed. Consequently, when the switch opens the charge on the capacitor maintains the gate-source potential on the output transistor of the current memory cell as it was when the switch was closed (assuming that this period was long enough to enable the capacitor to become fully charged to the gate-source potential). Transistors T6-T8 form a current mirror circuit whose input branch comprises the diode connected transistor T8 and which has two output branches formed by transistors T6 and T7 respectively. The channel width/length ratios of transistors T6, T7 and T8 are selected so that transistor T6 produces a current equal to the input current and transistor T7 produces a current equal to A times the input current.

The operation of the circuit shown in FIG. 1 is as follows. Inputs 1 and 5 are fed with input currents $-i$ and $i$ which are sampled currents and remain substantially constant during each sampling period and change in successive sampling periods to follow the continuous analogue signal from which they are derived. A feedback current $i_f$, which is the difference between the currents produced by transistors T4 and T6, is produced in the feedback path 7 while an output current $i_o$, which is the difference between the currents produced by transistors T5 and T7, is produced at the output 8. During the $\bar{\phi}$ phase of a sampling period (n−1) a current equal to $j-i(n-1)+i_f$ is applied to the input of the first memory cell, where $i_f=i_o(n-1)/A$. Consequently the current produced at the drain electrode of transistor T2($I_2$) can be derived from the equation $$I_2 = j + i_o(n-1)/A - i(n-1) \quad (1)$$

During the next $\phi$ phase in sampling period n the current fed to the input of the second memory cell $I_3 = I_2 - i(n)$. The output current $i_o(n) = A(I_3 - j)$ $$\begin{aligned} i_o(n) &= A[j + i_o(n-1)/A - i(n-1) - i(n) - j] \\ &= i_o(n-1) - A[i(n) + i(n-1)] \end{aligned} \quad (2)$$

Converting to the z domain $$i_o(z) = i_o(z)z^{-1} - A[i(z) + i(z)z^{-1}] \quad (3)$$

$$H(z) = \frac{i_o(z)}{i(z)} = -A \cdot \frac{1 + z^{-1}}{1 - z^{-1}}$$

The lossless continuous time integrator transfer function is $$H(s) = -/s\tau$$

which transforms to $$H(z) = \frac{-T}{2\tau} \cdot \frac{1 + z^{-1}}{1 - z^{-1}} \quad (4)$$

where $s \to \frac{2}{T} \cdot \frac{1 - z^{-1}}{1 + z^{-1}}$

-continued $$A = \frac{T}{2\tau}$$

where T is the sampling period and $\tau$ is the R.C. product of the integrator.

Thus FIG. 1 shows a bilinear integrator comprising a first input 1 and a second input 5. The input 1 is connected to the input of a first current memory cell formed by transistors T1 and T2, capacitor C1, and switch S1. The first current memory cell is arranged to store a current applied to its input during a first portion $\bar{\phi}$ of each sampling period and to reproduce that current at its output during a second portion $\phi$ of the succeeding sampling period. The second input 5 is connected to the input of a second current memory cell formed by transistors T3, T4, and T5, capacitor C2 and switch S3 via the switch S2. During a second portion $\phi$ of each sampling period the current applied to the second input 5 and the current produced at the output of the first current memory cell are applied to the input of second current memory cell. The second current memory cell has two outputs (from the drain electrodes of transistors T4 and T5). The first output is fed back to the input of the first current memory cell while the second output is fed to the integrator output 8.

The circuit shown in FIG. 1 performs the same function as a switched capacitor bilinear lossless integrator without requiring accurately defined capacitors. The capacitors in the memory cells do not need to have accurately defined values as there is no charge transfer between capacitors. Their function is merely to store the gate-source voltage of the transistor to which they are connected when the switches are open.

A lossy bilinear integrator is also useful since some biquadratic sections are made from feedback loops comprising a lossy integrator and an ideal integrator which together simulate a damped resonant circuit. One example is a Tow-Thomas biquadratic section. A lossy bilinear integrator may be constructed using the circuit shown in FIG. 1 if the transistors T4 and T6 are scaled by a factor B, where B is less than one, instead of being identical to transistors T3 and T8, respectively.

If the previous analysis is followed (equations 1 to 4) it can be shown that for the modified circuit $$H(z) = -A \cdot \frac{1 + z^{-1}}{1 - Bz^{-1}} \quad (5)$$

The continuous time lossy integrator transfer function is $$H(s) = -\frac{1}{a + s\tau}$$

Using the bilinear z transform this maps to $$H(z) = -\frac{T}{aT + 2} \cdot \frac{1 + z^{-1}}{1 - \frac{(2\tau - aT)}{(2\tau + aT)}z^{-1}} \quad (6)$$

Clearly if $A = \frac{T}{aT + 2\tau}$ and $B = \frac{2\tau - aT}{2\tau + aT}$ then a lossy integrator is formed with a transfer function corresponding to $$H(s) = \frac{-1}{a + sT}.$$

Figure 3:
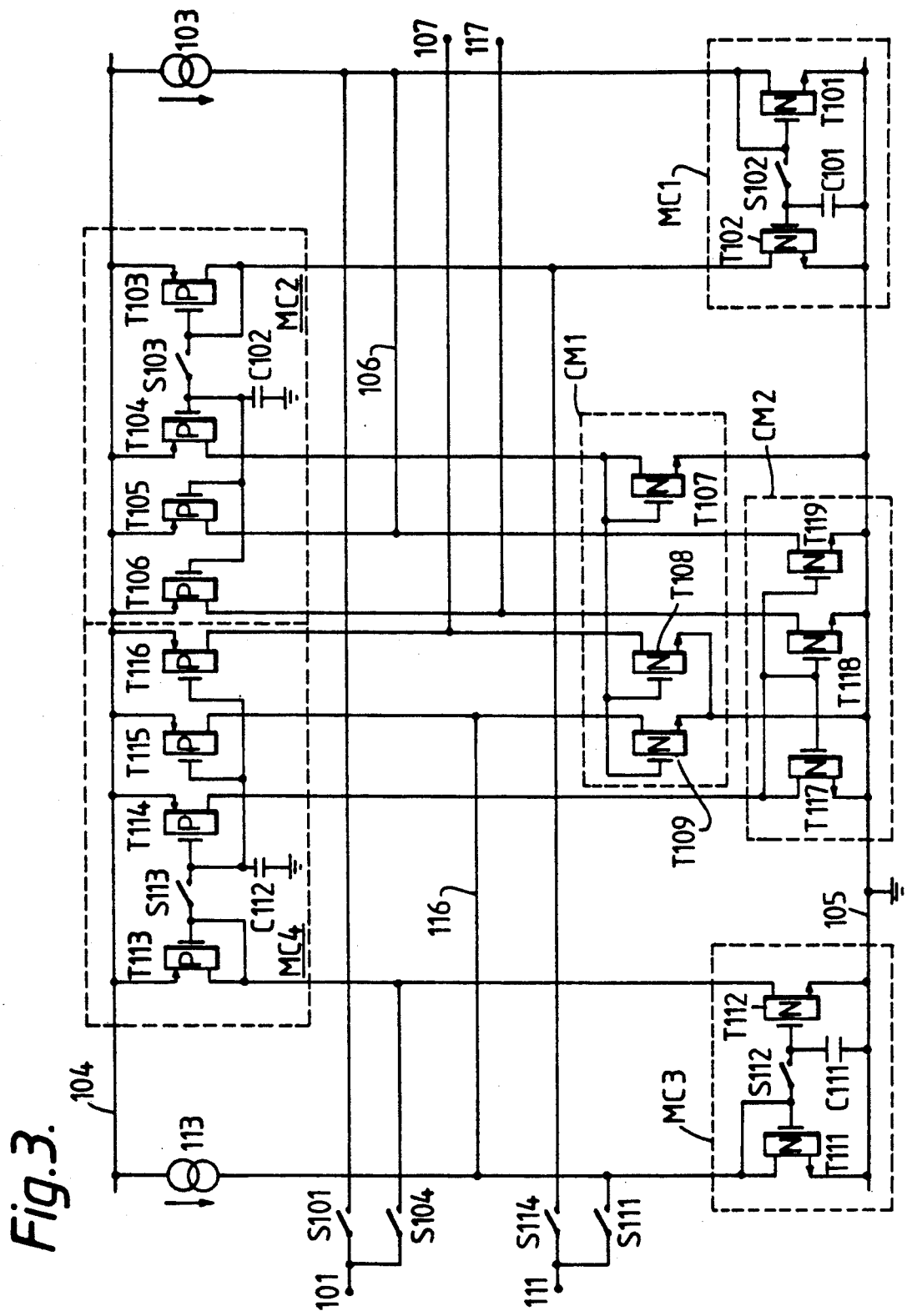
FIG. 3 is a circuit diagram of a second embodiment of an integrated circuit according to the invention.

FIG. 3 shows a fully differential bilinear integrator which has first and second input terminals 101 and 111. The input terminal 101 is connected via a switch S101 to the junction of a current source 103 and the drain electrode of an n-channel field effect transistor T101. The other end of the current source 103 is connected to a positive supply rail 104 while the source electrode of transistor T101 is connected to a negative supply rail 105. The drain electrode of transistor T101 is further connected to its gate electrode and to one end of a switch S102. The other end of switch S102 is connected to the junction of a capacitor C101 and the gate electrode of an n-channel field effect transistor T102. The other end of the capacitor C101 and the source electrode of transistor T102 are connected to the negative supply rail 105. The drain electrode of transistor T102 is connected to the drain and gate electrodes of a p-channel field effect transistor T103 whose source electrode is connected to the positive supply rail 104. The gate electrode of transistor T103 is connected via a switch S103 to the junction of a capacitor C102 and the gate electrode of a p-channel field effect transistor T104. The other end of the capacitor C102 is connected to the negative supply rail 105. The gate electrode of transistor T104 is further connected to the gate electrodes of two p-channel field effect transistors T105 and T106. The source electrodes of transistors T104, T105 and T106 are each connected to the positive supply rail 104. The drain electrode of transistor T104 is connected to the drain and gate electrodes of an n-channel field effect transistor T107 whose source electrode is connected to the negative supply rail 105. The gate electrode of transistor T107 is further connected to the gate electrodes of two n-channel field effect transistors T108 and T109. The source electrodes of transistors T108 and T109 are both connected to the negative supply rail 105.

Input terminal 111 is connected via a switch S111 to the junction of a current source 113 and the drain electrode of an n-channel field effect transistor T111. The other end of the current source 113 is connected to the positive supply rail 104 while the source electrode of transistor T111 is connected to the negative supply rail 105. The drain electrode of transistor T111 is further connected to its gate electrode and to one end of a switch S112. The other end of the switch S112 is connected to the junction of a capacitor C111 and the gate electrode of an n-channel field effect transistor T112. The other end of capacitor C111 and the source electrode of transistor T112 are connected to the negative supply rail 105. The drain electrode of transistor T112 is connected to the junction of the drain and gate electrodes of a p-channel field effect transistor T113 whose source electrode is connected to the positive supply rail 104. The gate electrode of transistor T113 is further connected via a switch S113 to the junction of a capacitor C112 and the gate electrode of a p-channel field effect transistor T114. The other end of capacitor C112 is connected to the negative supply rail 105. The gate electrode of transistor T114 is further connected to the gate electrodes of two p-channel field effect transistors T115 and T116. The source electrodes of transistors T114, T115 and T116 are connected to the positive supply rail 104. The drain electrode of transistor T114 is connected to the drain and gate electrodes of an n-channel field effect transistor T117 whose source electrode is connected to the negative supply rail 105. The gate electrode of transistor T117 is further connected to the gate electrodes of two n-channel field effect transistors T118 and T119 whose source electrodes are connected to the negative supply rail 105. The drain electrodes of transistors T115 and T116 are connected to the drain electrodes of transistors T109 and T108, respectively. Similarly, the drain electrodes of transistors T105, and T106 are connected to the drain electrodes of transistors T119 and T118 respectively.

The input terminal 101 is further connected via a switch S104 to the junction of the drain electrodes of transistors T112 and T113. The input terminal 111 is further connected through a switch S114 to the junction of the drain electrodes of transistors T102 and T103. A first feedback connection 106 is connected between the junction of the drain electrodes of transistors T105 and T119 and the junction of the current source 103 and the drain electrode of transistor T101. A second feedback connection 116 is connected between the junction of the drain electrodes of transistors T115 and T109 and the junction of the current source 113 and the drain electrode of transistor T111. A first output terminal 107 is connected to the junction of the drain electrodes of transistors T116 and T108 while a second output terminal 117 is connected to the junction of the drain electrodes of transistors T106 and T118.

The transistors T101 and T102, the capacitor C101 and the switch S102 form a first current memory cell MC1 which produces at its output a stored current equal to the current previously applied to its input. A second current memory cell MC2 is formed by transistors T103 and T104, the switch S103 and the capacitor C102. This current memory cell includes two further transistors T105 and T106. Consequently, the current memory cell MC2 has three outputs, the first at the drain of transistor T104 which produces a first stored current equal to the current previously applied to the drain electrode of transistor T103, a second stored current at the drain electrode of transistor T105 which is equal to half the current previously applied to the drain electrode of transistor T103 and a third stored current at the drain electrode of transistor T106 which is equal to A times the current previously applied to the drain electrode of transistor T103. A third current memory cell MC3 is formed by transistors T111 and T112, switch S112 and capacitor C111. This current memory cell produces a stored current output from the drain electrode of transistor T112 which is equal to the current previously applied to the drain electrode of transistor T111. A fourth current memory cell MC4 is formed by transistors T113 and T114, switch S113 and capacitor C112. The current memory cell MC4 further includes transistors T115 and T116 and as a result will produce stored currents in the ratio 1:1/2: A times the current previously apPlied to the drain electrode of transistor T113 at the drain electrodes of transistors T114, T115 and T116 respectively. Transistors T107, T108 and T109 form a current mirror circuit CM1, having an input branch formed by transistor T107 and two output branches which are formed by transistors T108 and T109 respectively. The output branch comprising transistor T108 produces a current of A times that applied to the input branch, while the output branch comprising transistor T109 produces an output current equal to half the input current applied to transistor T107. A second current mirror circuit CM2 is formed by transistors T117, T118 and T119. The first output branch of the current mirror circuit formed by transistor T118 produces a current of A times that applied to the input branch comprising transistor T117, while the second output branch comprising transistor T119 produces a current of half of that applied to the input branch.

The operation of the integrator shown in FIG. 3 will be described using the waveform described in FIG. 2. The switches S101, S111, S112 and S102 are closed during the $\bar{\phi}$ phase and the switches S104, S114, S103 and S113 are closed during the $\phi$ phase.

The currents $I_i$, $I_2$, $I_3$, $I_4$, $I_5$, $I_6$ and $I_8$ are the currents at the input of the current memory MC3, at the output of the current memory MC3, at the input of the current memory MC4, at the first output branch (formed by transistor T114) of the current memory MC4, at the second output branch (formed by transistor T115) of the current memory MC4, at the third output branch (formed by transistor T116) of the current memory MC4, and at the first output branch (formed by transistor T118) of the current mirror circuit CM2, respectively. Similarly, the currents $I_i'$, $I_2'$, $I_3'$, $I_4'$, $I_5'$, $I_6'$ and $I_8'$ are the currents at the input of the current memory circuit MC1, the output of the current memory circuit MC1, at the input of the current memory circuit MC2, at the first output branch (formed by transistor T104) of the current memory circuit MC2, at the second output branch (formed by transistor T105) of the current memory circuit MC2, at the third output branch (formed by transistor T106) of the current memory circuit MC2, and at the first output branch (formed by transistor T108) of the current mirror circuit CM1, respectively. The currents $i_f$ and $i_f'$ are the currents on lines 116 and 106, respectively.

It is assumed that input terminals 101 and 111 receive the differential input currents $i^+$ and $i^-$ respectively and that output terminals 107 and 117 produce differential output currents $i_o^+$ and $i_o^-$ respectively.

During the $\phi$ phase in sampling period $(n-1)$ $$I_1 = I_2 = j + i_f + i^- \text{ where } i_f = i_o^+(n-1)/2A,$$
$$i^- = i^-(n-1),$$

and j is the current produced by current source 113

$$I_2 = j + i_o^+(n-1)/2A + i^-(n-1)$$

Similarly $I_2' = j + i_o^-(n-1)/2A + i^+(n-1)$
During the $\phi$ phase in sampling period n $$I_3 = I_4 = 2I_5 = I_6/A = I_8/A = I_2 - i^+ \text{ where } i^+ = i^+(n)$$

$$I_6 = I_8 = A[i_o^+(n-1)/2A + i^-(n-1) - i^+(n) + j] =$$

$$i_o^+(n-1)/2 - A[i^+(n) - i^-(n-1)] + Aj$$

Similarly $$I_6' = I_8' = i_o^-(n-1)/2 - A[i^-(n) - i^+(n-1)] + Aj$$

$$i_o^+ = I_6 - I_8' = i_o^+(n-1)/2 - i_o^-(n-1)/2 -$$

$$A[i^+(n) - i^-(n) + i^+(n-1) - i^-(n-1)] =$$

$$i_o(n-1)/2 - A[i(n) + i(n-1)]$$

where $i(n) = (i_n^+ - i_n^-)$ and $i_o = i_o^+ - i_o^-$ $$i_o^- = I_6' - I_8 = i_o^-(n-1)/2 - i_o^+(n-1)/2 -$$

-continued
$$A[i^-(n) - i^+(n) + i^-(n-1) - i^+(n-1)] =$$

$$-i_o(n-1)/2 + A[i(n) + i(n-1)]$$

Consequently $i_o^- = -i_o^+$ $$i_o(n) = i_o^+ - i_o^- = 2i_o^+ = i_o(n-1) - 2A(i(n) + i(n-1))$$

Converting to the z domain $$i_o(z) = i_o(z)z^{-1} - 2A(i(z) + i(z)z^{-1})$$

$$H(z) = \frac{i_o(z)}{i(z)} = \frac{-2A \, 1 + z^{-1}}{1 - z^{-1}}$$

Mapping onto the continuous time integrator $$A = T/4$$

If the current produced by the output branches of current memory circuits MC2 and MC4 formed by transistors T105 and T115 respectively and the output branches of current mirror circuits CM1 and CM2 formed by transistors T109 and T119 respectively are made equal to B/2, where B is less than one then a lossy integrator is formed.

Figure 4:
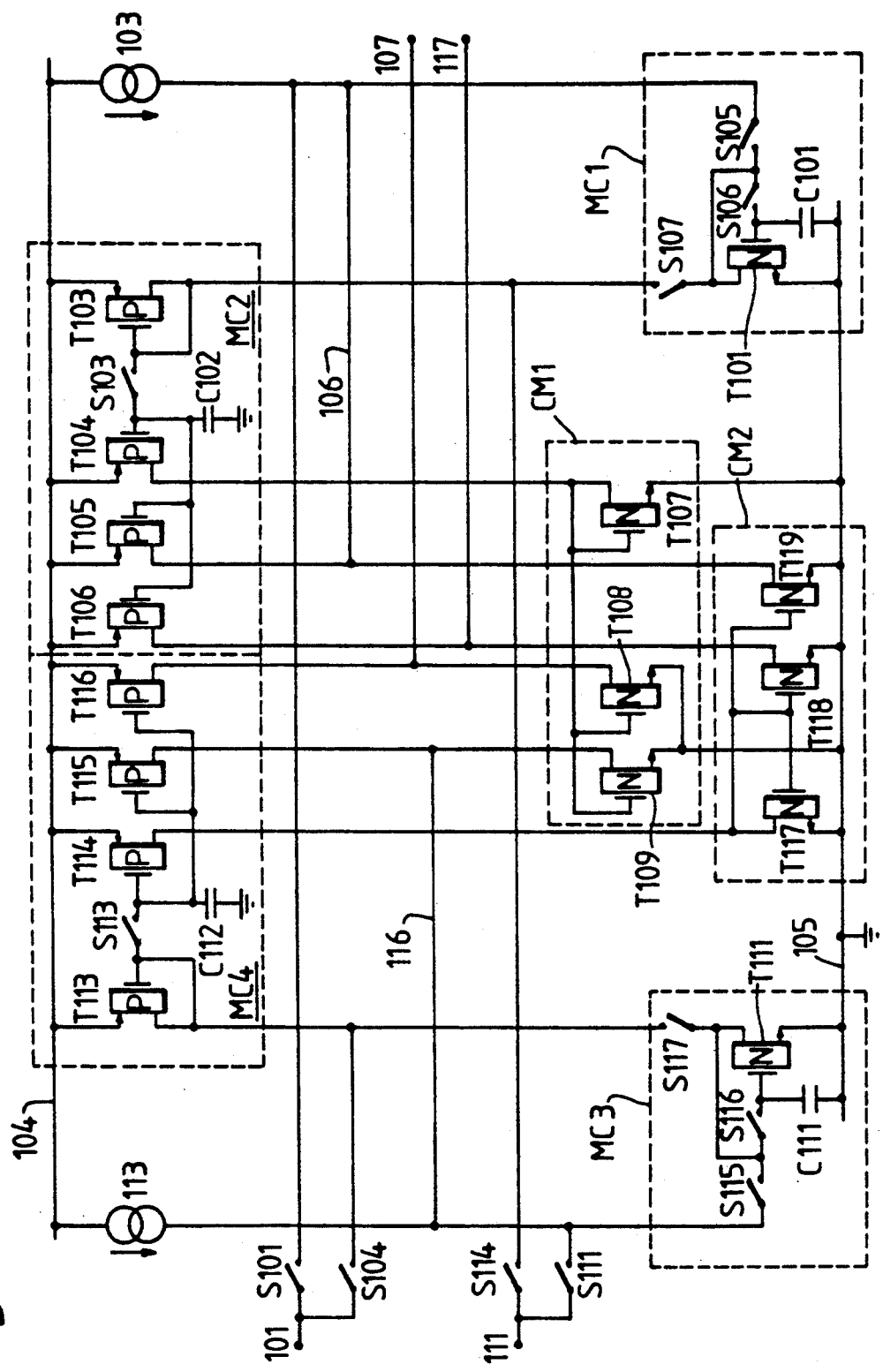
FIG. 4 is a circuit diagram of a third embodiment of an integrator circuit according to the invention.

FIG. 4 shows a fully differential bilinear ideal integrator which is similar to that shown in FIG. 3, the only difference being the form of the current memory cells MC1 and MCI. The current memory cell MC3 comprises a switch S105 connected between the current source 103 and the drain electrode of transistor T101. A further switch S106 is connected between the drain and gate electrodes of transistor T101. The capacitor C101 is connected between the gate and source electrodes of transistor T101, the switch S102 being omited together with the transistor T102. A third switch S107 is connected between the drain electrode of transistor T101 and the drain electrode of transistor T103. The current memory cell MC3 comprises a first switch S115 connected between the current source 113 and the drain electrode of transistor T111. A second switch S116 is connected between the drain and gate electrodes of transistor T111 while the capacitor C111 is directly connected between the gate and source electrodes of transistor T111. The switch S112 and transistor T112 in the circuit of FIG. 3 are omitted. A further switch S117 is connected between the drain electrode of transistor T111 and the drain electrode of transistor T113.

The operation of the integrator shown in FIG. 4 is essentially the same as for the integrator shown in FIG. 3, the difference lying in the mode of operation of the current memory cells MC1 and MC3. The switches S105 and S106 in the current memory circuit MC1 are closed during the $\bar{\phi}$ phase and the switch S107 is closed during the $\phi$ phase Thus, during the $\bar{\phi}$ phase the transistor T101 is connected as a diode and the input current applied to its drain electrode causes a given source-gate potential to be set up and the capacitor C101 charges to that gate potential. At the end of the $\bar{\phi}$ phase the switches S105 and S106 open and consequently the current through the transistor is determined by the voltage across the capacitor C101. During the $\phi$ phase the switch S107 is closed and hence the current from the drain electrode of transistor T101 will be equal to the current applied through switches S105 and S106 in the preceding $\bar{\phi}$ phase. The current cell circuit MC3 operates in the same manner, the switches S115 and S116 being closed during the $\bar{\phi}$ phase and the switch S117 being closed during the $\phi$ phase.

Figure 5:
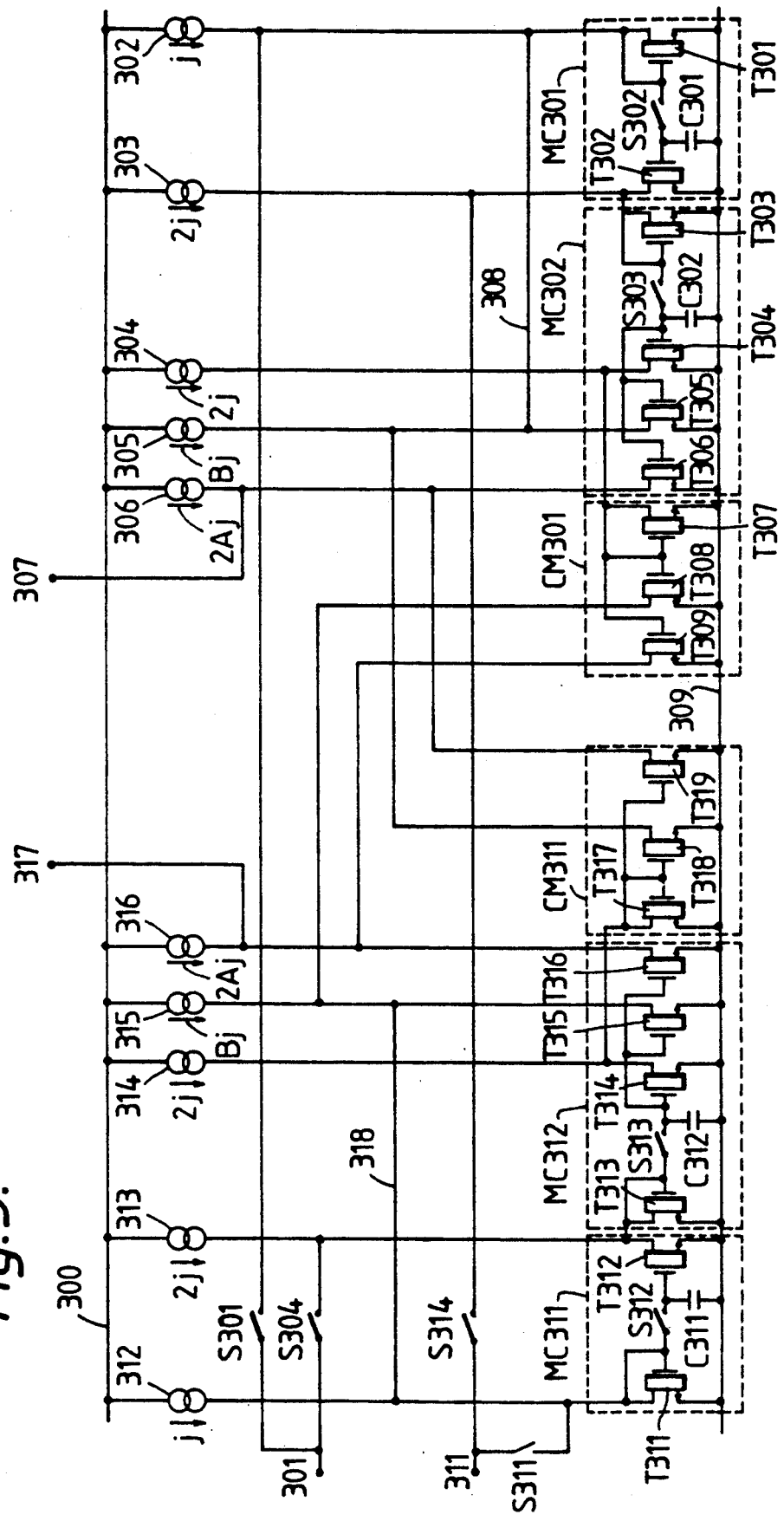
FIG. 5 is a circuit diagram of a fourth embodiment of an integrator circuit according to the invention.

FIG. 5 shows a bilinear integrator in which signal currents flow only through n-channel field effect transistors. The circuit shown in FIG. 5 has two input terminals 301 and 311. The input terminal 301 is connected via a switch S301 to the junction of a current source 302 and a drain electrode of an n-channel field effect transistor T301. The other end of the current source 302 is connected to a positive supply rail 300 while the source electrode of transistor T301 is connected to a negative supply rail 309. The drain electrode of transistor T301 is further connected to its gate electrode and to one end of a switch S302. The other end of the switch S302 is connected to the junction of a capacitor C301 and the gate electrode of an n-channel field effect transistor T302. The other end of the capacitor C301 and the source electrode of transistor T302 are connected to the negative supply rail 309. The drain electrode of transistor T302 is connected via a current source 303 to a positive supply rail 300 and to the drain electrode of an n-channel field effect transistor T303. The drain electrode of transistor T303 is also connected to its gate electrode and to one end of a switch S303 while its source electrode is connected to the negative supply rail 309. The other end of the switch S303 is connected to the junction of a capacitor C302 and the gate electrodes of three n-channel field effect transistors T304, T305 and T306. The other end of capacitor C302 and the source electrodes of transistors T304, T305 and T306 are all connected to the negative supply rail 309. The drain electrode of transistor T304 is connected via a current source 304 to the positive supply rail 300, the drain electrode of transistor T305 is connected to the positive supply rail via a current source 305, and the drain electrode of transistor T306 is connected to the positive supply rail 300 by a current source 306. The drain electrode of transistor T304 is further connected to the drain electrode of an n-channel field effect transistor T307 whose source electrode is connected to the negative supply rail 309. The drain electrode of transistor T307 is further connected to its gate electrode and to the gate electrodes of two further n-channel field effect transistors T308 and T309. The source electrodes of transistors T308 and T309 are connected to the negative supply rail 309 while the drain electrodes are connected to the positive supply rail 300 via respective current sources 315 and 316.

Input terminal 311 is connected by a switch S311 to the junction of a current source 312 and the drain electrode of an n-channel field effect transistor T311. The other side of the current source 312 is connected to the positive supply rail 300 while the source electrode of transistor T311 is connected to the negative supply rail 309. The drain electrode of transistor T311 is further connected to its gate electrode and to one end of a switch S312. The other end of the switch S312 is connected to the junction of a capacitor C311 and the gate electrode of an n-channel field effect transistor T312. The other end of the capacitor C311 and the source electrode of the transistor T312 are both connected to the negative supply rail 309. The drain electrode of transistor T312 is connected to the positive supply rail 300 via a current source 313 and to the drain electrode of an n-channel field effect transistor T313 whose source electrode is connected to the negative supply rail 309. The drain electrode of transistor T313 is further connected to its gate electrode and to one end of a switch S313. The other end of switch S313 is connected to the junction of a capacitor C312 and the gate electrode of an n-channel field effect transistor T314. The other end of the capacitor C312 and the source electrode of transistor T314 are connected to the negative supply rail 309. The gate electrode of transistor T314 is further connected to the gate electrodes of two n-channel field effect transistors T315 and T316 whose source electrodes are connected to the negative supply rail 309. The drain electrodes of transistors T315 and T316 are connected to the positive supply rail 300 via current sources 315 and 316, respectively. The drain electrode of transistor T314 is connected to the positive supply rail 300 via a current source 314 and to the drain electrode of an n-channel field effect transistor T317. The drain electrode of transistor T317 is connected to its gate electrode and to the gate electrodes of two further n-channel field effect transistors T318 and T319. The source electrodes of transistors T317, T318 and T319 are connected to the negative supply rail 309. The drain electrodes of transistors T318 and T319 are connected to the positive supply rail 300 via current sources 305 and 306 respectively. An output terminal 307 is connected to the junction of the current source 306 and the drain electrode of transistor T306 while an output terminal 317 is connected to the junction of a current source 316 and drain electrode of the transistor T316. A feedback connection 308 is provided between the drain electrode of transistor T305 and the drain electrode of transistor T301 while a feedback connection 318 is connected between the drain electrode of transistor T315 and the drain electrode of transistor T311. The input terminal 301 is further connected by a switch S304 to the junction of the current source 313 and the drain electrode of transistor T312 while the input terminal 311 is further connected through a switch S314 to the junction of a current source 303 and the drain electrode of transistor T302.

The transistors T301, T302, the capacitor C301 and the switch S302 form a first current memory cell MC301. The transistors T303 to T306, the switch S303 and the capacitor C302 form a second current memory cell MC302. The second current memory cell MC302 has three outputs taken from the drain electrodes of transistors T304, T305 and T306, respectively. The output from the drain electrode of transistor T304 has the same value as the current previously applied to the drain electrode of transistor T303. The current produced by transistor T305 is equal to B/2 times the current previously applied to the drain electrode of transistor T303 while the drain electrode of transistor T306 produces an output current equal to A times the current previously applied to the drain electrode of transistor T303. The transistors T311 and T312, the capacitor C311 and the switch S312 form a third current memory cell MC311. The output of the third current memory cell is derived from the drain electrode of transistor T312 which produces a current equal to that previously applied to the drain electrode o: transistor T311. The transistors T313, T314, T315 and T316, the capacitor C312 and the switch S313 form a fourth current memory cell MC312. The current produced at the drain electrode of transistor T314 is equal to the current previously applied to the drain electrode of transistor T313, the current produced at the drain electrode of transistor T315 is equal to B/2 times the current previously applied to the drain electrode of transistor T313 and the current produced at the drain electrode of transistor T316 is equal to A times the current previously applied to the drain electrode of transistor T313. The transistors T307, T308 and T309 form a first current mirror circuit CM301. The channel width/length ratios of the transistors are selected so that the current produced at the drain electrode of transistor T308 is equal to B/2 times the current applied to the drain electrode of transistor T307 while the current produced by the drain electrode of transistor T309 is equal to A times the current applied to the drain electrode of transistor T307. Transistors T317, T318 and T319 form a second current mirror circuit CM311. The current produced by transistor T318 is equal to B/2 times the current applied to transistor T317 while the current produced by transistor T319 is equal to A times the current applied to transistor T317. The current sources 302 and 312 each produce a current j, the current sources 303, 304, 313 and 314 all produce the current 2j, the current sources 305 and 315 each produce the current Bj while the current sources 306 and 316 each produce the current 2Aj. The switches S301, S302, S311 and S312 are closed during the $\overline{\phi}$ phase while the switches S304, S303, S314 and S313 are closed during the $\phi$ phase, the $\phi$ and $\overline{\phi}$ phases being as defined in FIG. 2.

The operation of the integrator shown in FIG. 5 will be described based on the assumption that the input terminals 301 and 311 receive differential input currents $i^+$ and $i^-$ respectively and that the output of terminals 317 and 307 produce the output differential currents $i_o^+$ and $i_o^-$ respectively. In the following analysis the currents $I_1$ to $I_9$ are defined as the currents flowing through transistors T311 to T319 respectively, while the current $I_1'$ to $I_9'$ are defined as the currents flowing through transistors T301 to transistors T309 respectively.

During the $\overline{\phi}$ phase of sampling period (n−1)

$$I_1 = I_2 = j + i^- + i_f$$

where $i_f = i_o^+(n-1)/2A$ $$i^- = i^-(n-1)$$

and for an ideal integrator B=1

$$I_2 = j + i_o^+(n-1)/2A + i^-(n-1)$$

Similarly $I_2' = j + i_o^-(n-1)/2A + i^+(n-1)$

During the $\phi$ phase of sampling period n $$
\begin{aligned}
I_3 &= I_4 = 2I_5 = I_6/A \\
I_4 &= 2j + i^+(n) - I_2 \\
&= 2j + i^+(n) - [j + i_o^+(n-1)/2A + i^-(n-1)] \\
&= j + i^+(n) - i_o^+(n-1)/2A - i^-(n-1) \\
I_6 &= A[j + i^+(n) - i_o^+(n-1)/2A - i^-(n-1)] \\
I_7 &= 2I_8 = I_9/A \\
&= 2j - I_4 \\
&= 2j - [j + i^+(n) - i_o^+n - 1)/2A - i^-(n-1)] \\
&= j - i^+(n) + i_o^+(n-1)/2A + i^-(n-1) \\
I_9 &= A[j - i^+(n) + i_o^+(n-1)/2A + i^-(n-1)]
\end{aligned}
$$

Similarly $$
\begin{aligned}
I_6' &= A[j + i^-(n) - i_o^-(n-1)/2A - i^+(n-1)] \\
I_9' &= A[j - i^-(n) + i_o^-(n-1)/2A + i^-(n-1)]
\end{aligned}
$$

$$
\begin{aligned}
i_o^+ &= 2Aj - [I_6 + I_9'] \\
&= 2Aj - A[j + i^+(n) - i_o^+(n-1)/2A - i^-(n-1) + \\
&\quad j - i^-(n) + i_o^-(n-1)/2A + i^+(n-1)] \\
&= -A[i^+(n) - i^-(n) + i^+(n-1) - i^-(n-1)] + \\
&\quad i_o^+(n-1)/2 - i_o^-(n-1)/2 \\
&= i_o(n-1)/2 - A[i(n) + i(n)]
\end{aligned}
$$

$$
\begin{aligned}
i_o^- &= 2Aj - [I_6' + I_9] \\
&= 2Aj - A[j + i^-(n) - i_o^-(n-1)/2A - i^+(n-1) + \\
&\quad j - i^+(n) + i_o^+(n-1)/2A + i^-(n-1)] \\
&= -i_o(n-1)/2 + A[i(n) + i(n-1)] \\
&= -i_o^+
\end{aligned}
$$

$$i_o(n) = i_o^+ - i_o^- = 2i_o^+ = i_o(n-1) - 2A[i(n) + i(n-1)]$$

Converting to the z domain $$i_o(z) = i_o(z)z^{-1} - 2A[i(z) + i(z)z^{-1}]$$

$$H(z) = i_o(z)/i(z) = -2A[(1 + z^{-1})/(1 - z^{-1})].$$

Mapping onto the continuous time ideal integrator $$A = T/4\tau$$

As with the integrator described with reference to FIGS. 1 to 3 a lossy integrator may be formed by making B less than 1.

It should be noted that the capacitors in any of the current memory circuit disclosed herein can be connected between the gate electrode of the respective transistor and any point of fixed potential. In particular, it is not necessary to connect the capacitor between the gate and source electrodes of the transistor. It is only necessary that the capacitor is able to store a charge which is dependent on the input current and maintain a gate voltage which maintains the output current when the associated switch is open. Clearly the most convenient points of fixed potential are the positive and negative supply rails, but if any other fixed voltages are generated in or supplied to the circuit they could equally be used.

The embodiments described have for simplicity and clarity used basic current mirror circuits. However, higher performance may be obtained by using techniques such as source degeneration resistors, cascode connection of transistors, or dynamic element matching.

From reading the present disclosure, other modifications will be apparent to persons skilled in the art. Such modifications may involve other features which are already known in the design and use of electrical or electronic circuits and component parts thereof and which may be used instead of or in addition to features already described herein. Although claims have been formulated to particular combinations of features, it should be understood that the scope of the disclosure of the present application also includes any novel feature or any novel combination of features disclosed herein either explicitly or implicitly or any modification of one or more of those features which would be obvious to persons skilled in the art, whether or not it relates to the same invention as presently claimed in any claim and whether or not it mitigates any or all of the same technical problems as does the present invention.

I claim:

1. A bilinear integrator circuit for sampled signal currents comprising: first and second inputs and an output, means for connecting the first input to an input of a first current memory cell which is arranged to store a current applied in a first portion of each sampling period and to reproduce a current, whose magnitude is dependent on the magnitude of the applied current, at an output of said first current memory cell during a second portion of that or a succeeding sample period, means for connecting the second input to an input of a second current memory cell which is arranged to store a current applied to its input in the second portion of each sampling period and to reproduce at each of a first and second output of the second current memory cell a current, whose magnitude is dependent upon that of the current applied to its input, during the first portion of that or a succeeding sampling period, means for connecting the first output of the second current memory cell to the input of the first current memory cell, means for connecting the output of the first current memory cell to the input of the second current memory cell, and means for connecting the second output of the second current memory cell to the output of the integrator circuit.

2. An integrator circuit as claimed in claim 1 wherein the second current memory cell produces an output current at its first output equal to B times the current applied to its input, where B is less than one.

3. An integrator circuit as claimed in claim 1 or claim 2 further comprising means coupled to the first current memory cell input for adding a bias current to the current applied to the first input of the integrator circuit, and means for subtracting appropriately scaled bias currents from first and second output currents of the second current memory cell so that an output current produced by the integrator circuit contains no bias current component.

4. An integrator circuit as claimed in claim 1 wherein the first current memory cell comprises a diode connected field effect transistor connected to its input, means connected a gate electrode of said field effect transistor through a switch to a gate electrode of a second similar field effect transistor, the first and second field effect transistors having source electrodes connected to a common point, said output of the first current memory cell being connected to a drain electrode of the second transistor, a capacitor connected between the source and gate electrodes of the second transistor, and means for closing the switch only during the first portion of each sampling period.

5. An integrator circuit as claimed in claim 3 wherein the first current memory cell comprises a first switch connected between its input and a drain electrode of a field effect transistor, a second switch connected between the gate and drain electrodes of the transistor, a capacitor connected between the gate and source electrodes of the transistor, a third switch connected between the drain electrode of the transistor and its output means for closing the first and second switches only during the first portion of each sampling period, and means for closing the third switch only during the second portion of each sampling period.

6. A bilinear integrator circuit as claimed in claim 1 for integrating a differential input current and for producing a differential output current, the integrator circuit further comprising a second output, a third current memory cell, a fourth current memory cell, means for coupling an output of the third current memory cell to an input of the fourth current memory cell, means for coupling a first output of the fourth current memory cell to an input of the third current memory cell, means for connecting the first input of the integrator circuit to the input of the first current memory cell during the first portion of each sampling period, means for connecting the first input of the integrator circuit to the input of the fourth current memory cell during the second portion of each sampling period, means for connecting the second input of the integrator circuit to the input of the third current memory cell during the first portion of each sampling period, means for connecting the second input of the integrator circuit to the input of the second current memory cell during the second portion of each sampling period, means for connecting the second output of the second current memory cell to the first output of the integrator circuit, and means for connecting a second output of the fourth memory cell to the second output of the integrator circuit.

7. An integrator circuit as claimed in claim 6 further comprising means for adding bias currents to the currents applied to the inputs of the first and third current memory cells and means for subtracting appropriately scaled bias currents from the outputs of the second and fourth current memory cells so that the output differential currents contain no bias current component.

8. An integrator circuit as claimed in claim 7 wherein all transistors which conduct signal currents comprise as n-channel field effect transistors.

9. An integrator circuit as claimed in claim 3 wherein the first current memory cell comprises a diode connected field effect transistor connected to its input, means connecting a gate electrode of said field effect transistor through a switch to a gate electrode of a second similar filed effect transistor, the first and second filed effect transistors having source electrodes connected to a common point, said output of the first current memory cell being connected to a drain electrode of the second transistor, a capacitor connected between the source and gate electrodes of the second transistor, and means for closing the switch only during the first portion of each sampling period.

10. An integrator circuit as claimed in claim 1 wherein the first current memory cell comprises a first switch connected between its input and a drain electrode of a field effect transistor, a second switch connected between the gate and drain electrodes of the transistor, a capacitor connected between the gate and source electrodes of the transistor, a third switch connected between the drain electrode of the transistor and its output, means for closing the first and second switches only during the first portion of each sampling period, and means for closing the third switch only during the second portion of each sampling period.

11. An integrator circuit as claimed in claim 2 wherein the first current memory cell comprises a first switch connected between its input and drain electrode of a field effect transistor, a second switch connected between the gate and drain electrodes of the transistor, a capacitor connected between the gate and source electrodes of the transistor, a third switch connect between the drain electrode of the transistor and its output, means for closing the first and second switches only during the first portion of each sampling period, and means for closing the third switch only during the second portion of each sampling period.

12. A bilinear integrator circuit as claimed in claims 2 or 4 for integrating a differential input current and for producing a differential output current, the integrator circuit further comprising a second output, a third current memory cell, a fourth current memory cell, means for coupling an output of the third current memory cell to an input of the fourth current memory cell, means for coupling a first output of the fourth current memory cell to an input of the third current memory cell, means for connecting the first input of the integrator circuit to the input of the first current memory cell during the first portion of each sampling period, means for connecting the first input of the integrator circuit to the input of the fourth current memory cell during the second portion of each sampling period, means for connected the second input of the integrator circuit to the input of the third current memory cell during the first portion of each sampling period, means for connecting the second input of the integrator circuit to then put of the second current memory cell during the second portion of each sampling period, means for connecting the second output of the second current memory cell to the first output of the integrator circuit, and means for connecting a second output of the fourth memory cell to the second output of the integrator circuit.

13. An integrator circuit as claimed in claim 12 further comprising means for adding bias currents to currents applied to the inputs of the first and third current memory cells and means for substrating appropriately scaled bias currents from the outputs of the second and fourth current memory cells so that the output differential currents contain no bias current component.

14. A bilinear integrator circuit as claimed in claim 10 for integrating a differential input current and for producing a differential output current, the integrator circuit further comprising a second output, a third current memory cell, a fourth current memory cell means for coupling an output of the third current memory cell to an input of the fourth current memory cell, means for coupling a first output of the fourth current memory cell to an input of the third current memory cell, means for connecting the first input of the integrator circuit to the input of the first current memory cell during the first portion of each sampling period, means for connected the first input of the integrator circuit to the input of the fourth current memory cell during the second portion of each sampling period, means for connecting the second input of the integrator circuit to the input of the third current memory cell during the first portion of each sampling period, means for connecting the second input of the integrator circuit to the input of the second current memory cell during the second portion of each sampling period, means for connecting the second output of the second current memory cell to the first output of the integrator circuit, and means for connecting a second output of the fourth memory cell to the second output of the integrator circuit.

15. An integrator circuit as claimed in claim 14 further comprising means for adding bias currents to currents applied to the inputs of the first and third current memory cells and means for subtracting appropriately scaled bias currents from the outputs of the second and fourth current memory cells so that the output differential currents contain no bias current component.

16. An integrator circuit as claimed in claim 1, 2, 4 or 6 wherein all transistors which conduct signal currents comprise n-channel field effect transistors.

17. An integrator circuit as claimed in claim 2 wherein the first current memory cell comprises a diode connected field effect transistor connected to its input, means connecting a gate electrode of said field effect transistor through a switch to a gate electrode of a second similar field effect transistor, the first and second field effect transistors having source electrodes connected to a common point, said output of the first current memory cell being connected to a drain electrode of the second transistor, a capacitor connected between the source and gate electrodes of the second transistor, and means for closing the switch only during the first portion of each sampling period.

18. An integrator circuit as claimed in claim 1 further comprising a first current source coupled via a first switch to a field effect transistor in said first current memory cell thereby to add a DC bias current t the current applied to the first input of the integrated circuit, and means for subtracting first and second scaled DC bias currents from first and second output currents, respectively, of the second current memory cell so that a bidirectional output current is produced at the integrator circuit output, said output current being substantially devoid of any bias current component.

* * * * *